(12) United States Patent
Werth et al.

(10) Patent No.: US 10,310,026 B2
(45) Date of Patent: *Jun. 4, 2019

(54) BIAS FIELD GENERATION FOR A MAGNETO SENSOR

(71) Applicant: Infineon Technologies AG, Neubiberg (DE)

(72) Inventors: Tobias Werth, Villach (AT); Klaus Elian, Alteglofsheim (DE); James Sterling, Novi, MI (US)

(73) Assignee: Infineon Technologies AG, Neubiberg (DE)

( * ) Notice: Subject to any disclaimer, the term of this patent is extended or adjusted under 35 U.S.C. 154(b) by 8 days.

This patent is subject to a terminal disclaimer.

(21) Appl. No.: 15/595,136

(22) Filed: May 15, 2017

(65) Prior Publication Data

US 2017/0248663 A1 Aug. 31, 2017

Related U.S. Application Data

(63) Continuation of application No. 15/056,284, filed on Feb. 29, 2016, now Pat. No. 9,678,170, which is a
(Continued)

(51) Int. Cl.
*G01B 7/30* (2006.01)
*G01R 33/00* (2006.01)
(Continued)

(52) U.S. Cl.
CPC .......... *G01R 33/0023* (2013.01); *B82Y 25/00* (2013.01); *G01D 5/12* (2013.01);
(Continued)

(58) Field of Classification Search
CPC ........ G01B 7/30; G01D 5/145; G01D 11/245; G01D 5/2451; G01D 5/00; G01P 3/487
(Continued)

(56) References Cited

U.S. PATENT DOCUMENTS

| 4,188,605 | A | 2/1980 | Stout |
| 4,496,303 | A | 1/1985 | Loubier |

(Continued)

FOREIGN PATENT DOCUMENTS

| DE | 3243039 A1 | 5/1984 |
| DE | 10123513 A1 | 3/2003 |

(Continued)

OTHER PUBLICATIONS

Hung, et al., "Effects of Addidtives on the Orientation and Strength of Plastic Ferrite Magnet", IEEE Transaction Magn., vol. 25, Sep. 1989, pp. 3267-3289.

(Continued)

*Primary Examiner* — Jermele M Hollington
*Assistant Examiner* — Taqi Nasir
(74) *Attorney, Agent, or Firm* — Schiff Hardin LLP

(57) ABSTRACT

Embodiments related to the generation of magnetic bias fields for magnetic sensing are described and depicted. In one embodiment, a sensor includes at least one magnetosensitive element, and a magnetic body with an opening, the magnetic body comprising magnetic material, the magnetic body having inclined surface sections shaped by the opening, wherein the sensor is arranged within the opening such that the magnetosensitive element is in lateral directions bounded by the inclined surface sections.

20 Claims, 10 Drawing Sheets

Related U.S. Application Data continuation of application No. 14/093,567, filed on Dec. 2, 2013, now Pat. No. 9,297,669, which is a continuation of application No. 12/885,349, filed on Sep. 17, 2010, now Pat. No. 8,610,430, which is a continuation-in-part of application No. 12/130,571, filed on May 30, 2008, now Pat. No. 8,058,870.

(51) Int. Cl.
| | |
|---|---|
| *B82Y 25/00* | (2011.01) |
| *G01R 33/07* | (2006.01) |
| *G01R 33/09* | (2006.01) |
| *H01L 43/08* | (2006.01) |
| *G01D 5/12* | (2006.01) |
| *G01R 3/00* | (2006.01) |
| *G01D 5/16* | (2006.01) |
| *G11B 5/00* | (2006.01) |

(52) U.S. Cl.
CPC .............. *G01D 5/16* (2013.01); *G01R 3/00* (2013.01); *G01R 33/0052* (2013.01); *G01R 33/072* (2013.01); *G01R 33/09* (2013.01); *G01R 33/091* (2013.01); *G01R 33/093* (2013.01); *G01R 33/098* (2013.01); *H01L 43/08* (2013.01); *G11B 2005/0008* (2013.01); *Y10T 29/49002* (2015.01)

(58) Field of Classification Search
USPC ...... 324/207.25, 66–67, 160–180, 71.1–157, 324/200–263, 750.01–764.01; 702/1–199; 73/1.01–36, 488–551
See application file for complete search history.

(56) References Cited

U.S. PATENT DOCUMENTS

| | | | |
|---|---|---|---|
| 4,785,242 A | 11/1988 | Vaidya et al. | |
| 5,210,489 A | 5/1993 | Petersen | |
| 5,260,653 A | 11/1993 | Smith et al. | |
| 5,781,005 A * | 7/1998 | Vig .................. | G01D 5/147 324/207.2 |
| 5,801,529 A | 9/1998 | Umemoto et al. | |
| 5,888,416 A | 3/1999 | Ikuma et al. | |
| 5,936,400 A | 8/1999 | Tchertkov et al. | |
| 5,963,028 A | 10/1999 | Engel et al. | |
| 6,063,322 A | 5/2000 | Draxler et al. | |
| 6,107,793 A | 8/2000 | Yokotani et al. | |
| 6,169,396 B1 | 1/2001 | Yokotani et al. | |
| 6,265,865 B1 | 7/2001 | Engel et al. | |
| 6,278,270 B1 | 8/2001 | Robles-Flores et al. | |
| 6,323,644 B1 * | 11/2001 | Taguchi .................. | B82Y 25/00 324/207.21 |
| 6,400,143 B1 | 6/2002 | Travostino et al. | |
| 6,437,563 B1 * | 8/2002 | Simmonds ............. | B82Y 15/00 324/204 |
| 6,875,621 B2 * | 4/2005 | Tondra .................. | G01N 27/745 204/400 |
| 6,891,368 B2 | 5/2005 | Kawano et al. | |
| 6,949,386 B2 | 9/2005 | Piguet et al. | |
| 7,112,955 B2 * | 9/2006 | Buchhold ............. | G01R 33/09 324/207.21 |
| 7,250,760 B2 | 7/2007 | Ao | |
| 7,301,331 B2 | 11/2007 | Kurumado | |
| 7,375,516 B2 | 5/2008 | Takenaga et al. | |
| 7,382,122 B2 | 6/2008 | Komatsu et al. | |
| 7,400,143 B2 | 7/2008 | Hayashi et al. | |
| 7,548,060 B2 | 6/2009 | Herrmann et al. | |
| 7,777,309 B2 | 8/2010 | Danno et al. | |
| 8,294,457 B2 * | 10/2012 | Schrubbe ................ | G01D 5/06 324/207.2 |
| 2003/0222642 A1 | 12/2003 | Butzmann | |
| 2004/0174164 A1 | 9/2004 | Ao | |
| 2005/0146052 A1 | 7/2005 | Sakamoto et al. | |
| 2005/0146323 A1 | 7/2005 | Kleinen et al. | |
| 2005/0173721 A1 | 8/2005 | Isoda | |
| 2006/0022670 A1 | 2/2006 | Kumar et al. | |
| 2006/0164388 A1 | 7/2006 | Akieda et al. | |
| 2006/0261801 A1 | 11/2006 | Busch | |
| 2006/0279280 A1 | 12/2006 | Minamitani et al. | |
| 2007/0001664 A1 | 1/2007 | Steinbrink et al. | |
| 2007/0018642 A1 | 1/2007 | Ao | |
| 2007/0063693 A1 | 3/2007 | Modest | |
| 2007/0075705 A1 | 4/2007 | Kurumado | |
| 2007/0077732 A1 | 4/2007 | Ito et al. | |
| 2007/0090829 A1 | 4/2007 | Kurita et al. | |
| 2007/0145972 A1 * | 6/2007 | Auburger et al. ............ 324/252 | |
| 2007/0194786 A1 | 8/2007 | Hatanaka et al. | |
| 2008/0116884 A1 | 5/2008 | Rettig et al. | |
| 2008/0204007 A1 | 8/2008 | Kim et al. | |
| 2009/0140725 A1 | 6/2009 | Ausserlechner | |
| 2009/0243595 A1 | 10/2009 | Theuss et al. | |
| 2009/0289623 A1 * | 11/2009 | Sano .................... | G01D 11/245 324/207.25 |
| 2012/0319682 A1 | 12/2012 | Ausserlechner | |

FOREIGN PATENT DOCUMENTS

| | | |
|---|---|---|
| DE | 102004063539 A1 | 9/2005 |
| DE | 60207560 T2 | 8/2006 |
| EP | 0357200 A2 | 3/1990 |
| JP | 60223095 A | 11/1985 |
| JP | 63084176 A | 4/1988 |
| JP | 11087797 A | 3/1999 |
| JP | 2000292203 A | 10/2000 |
| JP | 2000298134 A | 10/2000 |
| JP | 2002286765 A | 10/2002 |
| JP | 20044294070 A | 10/2004 |

OTHER PUBLICATIONS

R.S. Popovic, et al., "Integrated Hall-Effect Mangetic Sensors", Department of Microengineering, EPFL, Swiss Federal Institute of Technology, CH-1015 Lausanne, Switzerland, 6 pgs., 2001.
R. F. Popovic, "Not-Plate-Like Hall Magnetic Sensors and Their Applications", Swiss Federal Institute of Technology Lausanne, Room INR 137, CH-1015 Lausanne EPFL, Switzerland, 10 pgs., 2000.
Paul Leroy, et al., Optimization of the Shape of Magnetic Field Concentrators to Improve the Sensitivity of Hall Sensors, Technisches Messen 73, 12 pgs., 2006.
USPTO, Non-Final Office Action dated Jun. 22, 2011 for U.S. Appl. No. 11/950,050, 38 pgs.
English machine translation of the detailed description of JP 11-087797 A, obtained on Jul. 11, 2011 form the JPO website.
USPTO, Non-Final Office Action dated Apr. 25, 2011 for U.S. Appl. No. 12/129,962, 23 pgs.
USPTO, Office Action dated Sep. 14, 2010 for U.S. Appl. No. 11/950,050.
USPTO, Office Action dated Apr. 20, 2010 for U.S. Appl. No. 11/950,050.
U.S. Appl. No. 11/950,050, filed Dec. 4, 2007.
U.S. Appl. No. 12/129,962, filed May 30, 2008.
USPTO, Office Action dated Aug. 17, 2009 for U.S. Appl. No. 12/129,962.
USPTO, Office Action dated Jan. 20, 2010 for U.S. Appl. No. 12/129,962.
USPTO, Office Action dated Oct. 29, 2010 for U.S. Appl. No. 12/129,962.
USPTO, Office Action dated Jan. 13, 2011 for U.S. Appl. No. 12/129,962.
Wikipedia, Permanent Magnets Information, 2011.
Hyperphysics, Permant Magnets Information, 2011.
USPTO, Office Action dated Sep. 21, 2011 for U.S. Appl. No. 12/129,962.

* cited by examiner

BIAS FIELD GENERATION FOR A MAGNETO SENSOR

REFERENCE TO RELATED APPLICATIONS

This application is a continuation of U.S. application Ser. No. 15/056,284, filed on Feb. 29, 2016, now U.S. Pat. No. 9,678,170; which is a continuation of U.S. application Ser. No. 14/093,567, filed on Dec. 2, 2013, now U.S. Pat. No. 9,297,669; which is a continuation of U.S. application Ser. No. 12/885,349, filed on Sep. 17, 2010, now U.S. Pat. No. 8,610,430; which is a continuation in part of U.S. application Ser. No. 12/130,571, filed on May 30, 2008, now U.S. Pat. No. 8,058,870; each of which is incorporated herein by reference in its entirety.

BACKGROUND

Sensors are nowadays used in many applications for monitoring, detecting and analyzing. One type of sensors includes magnetic sensors which are capable of detecting magnetic fields or changes of magnetic fields. Magnetoresistive effects used in magnetoresistive sensors include but are not limited to GMR (Giant Magnetoresistance), AMR (Anisotropic Magnetoresistance), TMR (Magneto Tunnel Effect), CMR (Colossal Magnetoresistance). Another type of magnetic sensors is based on the Hall effect. Magnetic sensors are used for example to detect position of moving or rotating objects, the speed or rotational speed of rotating objects etc.

Magnetoresistive sensors are typically sensitive to the in plane x and y components of the Magnetic fields which may be herein referred to as lateral components of the magnetic fields. One component of the magnetic field which may without limitation be referred to as y-component changes the sensitivity, whereas the other component x has a linear relation to the resistance at low fields below for example 5 mT. This component is typically used as the sensing field component.

Typically, the magnetoresistive effect has a working range in which the sensitivity for example the change of resistance versus magnetic field change is high. Outside of the working range, unfavorable behavior of the magnetoresistive effect such as saturation limits does not allow the use of the sensor for many applications. The working range may also be referred for some magnetoresistive devices as the anisotropic range. In applications such as for example for the detection of a rotational speed of an object, a bias magnet field is applied to the magnetoresistive sensors in order to avoid saturation of the magnetoresistive sensor. Typical examples include for example a back bias magnet arrangement. In the back bias magnet arrangement, the magnetic sensor is provided between the object to be sensed and the bias magnet.

SUMMARY

According to one aspect, embodiments include a manufacturing method comprising providing a bias field generator to generate a bias magnetic field having a field component in a first direction, wherein the bias field generator comprises a body of permanent magnetic material or magnetizable material with a cavity such that the cavity is laterally bounded by material of the body at least in a second and third direction, the second direction being orthogonal to the first direction and the third direction being orthogonal to the second direction and the first direction and arranging a magneto sensor in a part of the cavity.

According to another aspect, a method comprises rotating an object, operating a magneto sensor to sense the rotation, wherein a bias magnetic field arrangement provides a bias field for sensing the rotation, the bias magnetic field arrangement comprising a magnetic body with an opening, the magnetic body comprising magnetic material, the opening extending in a vertical direction and in lateral directions, wherein the opening is in lateral directions bounded by magnetic material of the magnetic body, wherein inclined surfaces sections of the magnetic body are shaped by the opening, wherein each of the inclined surface sections comprise an inclination angle between the surface sections and at least one lateral direction in the range between 5° and 20°.

According to a further aspect, a device comprises a sensor having at least one magnetosensitive element and a magnetic body with an opening, the magnetic body comprising magnetic material, the magnetic body having inclined surface sections shaped by the opening, wherein the sensor is arranged within the opening such that the magnetosensitive element is in lateral directions bounded by the inclined surface sections.

DETAILED DESCRIPTION

Figure 1A:
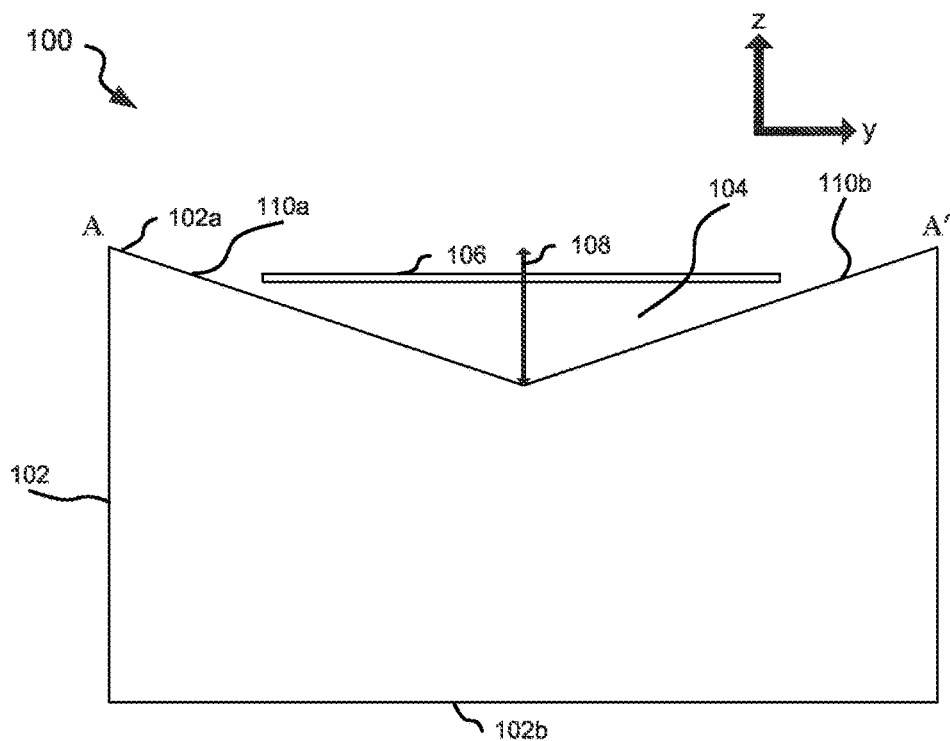
FIGS. 1a to 1h schematic cross-sectional views of embodiments.

The following detailed description explains exemplary embodiments of the present invention. The description is not to be taken in a limiting sense, but is made only for the purpose of illustrating the general principles of embodiments of the invention while the scope of protection is only determined by the appended claims.

It is to be understood that elements or features shown in the drawings of exemplary embodiments might not be drawn to scale and may have a different size or different extension in one direction with respect to other elements.

Further, it is to be understood that the features described or shown in the various exemplary embodiments may be combined with each other, unless specifically noted otherwise.

In the various figures, identical or similar entities, modules, devices etc. may have assigned the same reference number.

Referring now to FIG. 1a, a first cross-sectional view according to embodiments is shown. The cross-sectional view is taken along a line A-A' at a location where the sensor is arranged. The plane shown in FIG. 1a is spanned by a first axis which may herein be also referred as vertical axis or vertical direction and a second axis. The second axis is with respect to the vertical direction defined by the first axis a lateral axis and may herein also be referred to as a second lateral axis or second lateral direction. The first axis may herein further on be referred to as z-axis or z direction, the second axis may herein further be referred to as y-axis or y direction.

FIG. 1a shows a device 100 having a body 102 formed of permanent magnetic material or magnetizable material such as soft magnetic material or a combination of both as will be described later in more detail. The body 102 constitutes a magnet for providing the magnetic bias field for a magneto sensor 106 such as a magnetoresistive sensor. In embodiments, the magnetic bias field along the x-axis generated at the sensor 106 may be about or above 5 mT (Milli Tesla), whereas the main bias field along the magnetization direction z may be higher than 100 mT. The body 102 shown in FIG. 1a has an opening 104 in the form of a cavity which does not completely penetrate through the body 102. The opening shapes the geometrical form of the main surface 102a of the body 102 to be non-planar. In FIG. 1a, the main surface 102a is the main surface of the body 102 which is closest to the sensor 106 while the main surface 102b is the opposite main surface farther from the sensor 106.

The cavity may in embodiments include shallow cavities such as shallow indentations. An angle of inclination of the surface sections shaped by the cavity may in one embodiment be selected from the range between 5° and 65° when taken from the x-axis. In one embodiment, the angle of inclination may be selected between 5° and 40°. In one embodiment, the angle of inclination may be selected between 5° and 20°.

In embodiments described below in more detail, the cavity may have a pyramid form, a conical form or a polyhedron form. As will be described later in more detail, the sensor 106 may be located completely within the body 102, i.e. within the maximum extensions of the body 102. Thus, in one embodiment the z-axis position of the sensor 106 may be below the maximum z-axis extension of the body 102.

The sensor 106 may comprise a semiconductor chip having at least one magnetoresistive or Hall sensor element provided thereon. The sensor 106 may have an integrated circuit included. The magnetoresistive sensing element may be a GMR, MTR, CMR, AMR element or any other form of magnetoresistive sensor elements. The magnetoresistive sensor may have two sensing elements provided in a gradiometer arrangement. Furthermore, in one embodiment, a differential signal may be supplied from at least two sensing elements for sensing an object. In one embodiment, the sensor includes a plurality of magnetoresistive sensing elements arranged in a Wheatstone bridge configuration. In one embodiment, the sensor 106 may comprise at least one Hall effect sensing element.

As can be seen from FIG. 1a, the opening 104 of the body 102 is bounded along the z-axis region 108 along both ends by surface sections 110a and 110b of the body 102. Thus, the opening 104 is at least for the z-axis region 108 surrounded in the y-direction by the surface sections 110a and 110b.

Figure 1B:
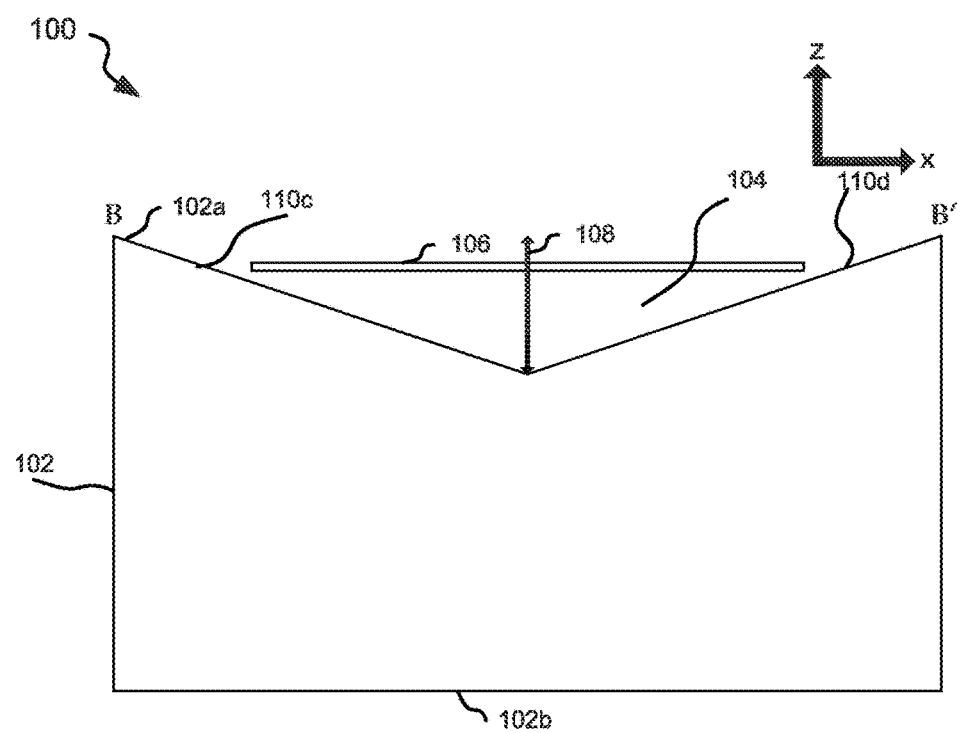

FIG. 1b shows a cross-sectional view of the same device 100 as shown in FIG. 1a in a plane spanned by the z-axis and a x-axis at the sensor location. The x-axis can be considered to be a lateral axis being orthogonal to the z-axis and y-axis. As can be seen from FIG. 1b, the opening 104 of the body 102 is bounded, at least for a z-axis region 108, also in the direction of the x-axis by surface sections 110c and 110d. Thus, the opening 104 is at least for the z-axis region 108 surrounded by the surface sections 110c and 110d in the x-direction.

In some embodiments, the opening 104 may be filled with other material such as mold material which is neither magnetic nor magnetizable.

It can be seen from the cross-section of FIG. 1a that the lateral width of the opening 104 in the direction of the y-axis decreases when moving in the vertical direction away from the sensor 106. Furthermore, it can be seen from the cross-section of FIG. 1b that the lateral width of the opening 104 in the direction of the x-axis decreases when moving in the vertical direction away from the sensor 106. In other words, the cross-sectional views of FIGS. 1a and 1b show a forming of the body 102 such that the surface 102a of the body 102 has a tapered shape in the vertical direction away from the sensor 106.

While FIGS. 1a and 1b show the overall surface 102a with the surface sections 110a, 110b 110c and 110d as having a non-orthogonal inclination with respect to the y-axis or x-axis, respectively, it is to be understood that the main surface 102a may in other embodiments have in addition one or more sections which are parallel to the x-axis.

Providing the main surface 102a such that an opening 104 is formed allows an independent two-dimensional shaping of the magnetic field generated by the body 102 which provides the bias field for the sensor 106 with reduced or zero lateral field components in the x- and y-directions.

In FIGS. 1a and 1b, the bias field for the sensor 106 is to be applied in the z-direction. Therefore, the magnetization direction of the body 102 is provided substantially in the z-direction. The working point where the sensor 106 is most sensitive is when both lateral components of the magnetic field, i.e. the x- and y-components are zero. However for small sizes of the body 102, due to the nature of magnetic field lines only appearing in closed loops, a plane extension of the surface 102a as for example for a cubic form of the body 102 with the magnetization in the z-direction would produce at the location of the sensor 106 a magnetic field with significant lateral field components in the x- and y-directions. When the size of the body 102 is small such as for example when the body 102 and the sensor 106 are integrated, the magnetic field lines returning in the space outside of the body 102 effect a significant curvature of the field lines from to z-direction towards the lateral directions at the location of the sensor 106. The lateral component of the magnetic field lines is with a cubic bias magnet of typical dimensions so strong that for example the field strength in the y component could cause the sensitivity to be decreased by a factor of 4 in case of GMR sensors.

The opening 104 in the body 102 addresses the avoiding of lateral field components and provides a reshaping of the field such that at the location of the sensor 106 the lateral components of the magnetic field at least in the x-direction and the y-direction are zero or reduced to almost zero.

Since the opening 104 is laterally bounded by permanent magnetic or magnetisable material of the body 102 at least in both the x-direction as well as the y-direction, the x-component and the y-component of the magnetic field are shaped. In particular, the x-components and y-components can be shaped independently from each other by the shape of the opening 104. This allows independent controlling of the magnetic x- and y-components by geometric shapes of the surface to reduce or eliminate the lateral field components caused by the effect of a small body size simultaneously at least for these two lateral dimensions. Independent controlling of the magnetic x- and y-components can be obtained for example by providing in the manufacturing process respectively different inclinations for the opening 104 in the x-direction and in the y-direction. Independent controlling provides the advantage to address that the influence of the magnetic field to the characteristic of the sensor 106 is different for the x-direction and the y-direction. The independent controlling allows increasing the region of zero lateral field components thereby relieving the need for extreme accurate positioning of the sensor 106 with respect to the body 102 and further to increase the sensitivity of the sensor 106 by providing exactly the magnetic field needed for maximum operation. However it is to be noted, that in some embodiments the sensor 106 might not be operated at the maximum sensitivity, i.e. off-centered from the center where maximum sensitivity is obtained. This can in a convenient way be achieved by sliding the sensor 106 along one of the lateral x- or y-direction as will be described later on in more detail.

In some embodiments, the opening 104 may be bounded by the body 102 at least within the vertical region where the sensor 106 is located. Furthermore, in embodiments, the opening 104 may be laterally bounded by the body 102 also for vertical regions which extend beyond the sensor location. Furthermore, in embodiments, the opening 104 may be completely surrounded by material of the body 102.

With the above described embodiments, the usage of a bias magnet of big size can therefore be avoided and it is possible to keep both the sensor 106 and the body 102 small without having degradation in the performance or sensitivity of the sensor 106. Furthermore, the region where a zero lateral field component or a lateral field component close to zero is obtained can be increased which might relax the requirement for extreme accurate positioning of the sensor 106 for maximum sensitivity. In some embodiments, such a region may have an extension in the x-direction from about ⅛ to ½ of the maximum extension of the cavity in the x-direction. Further, this region may have simultaneously an extension in the y-direction from about ⅛ to about ½ of the maximum extension of the cavity in the y-direction.

Thus compared to the usage of large bias magnets, a price advantage can be achieved and the dimensions of device 100 can be kept small. In one embodiment, the body 102 has lateral dimensions in the x- and y-direction smaller than 15 mm. In one embodiment, the body 102 has lateral dimensions in the x- and y-direction smaller than 10 mm. In one embodiment, the body 102 has lateral dimensions in the x- and y-direction smaller than 7.5 mm. The dimension of the body 102 in z-direction may in some embodiments be smaller than 10 mm. The body 102 may for example have a rectangular or cubic form where the extension in each of the x-, y- and z-dimensions is not shorter than ½ of the maximum of the extensions in the x-, y- and z-dimensions of the body 102.

Figure 1C:
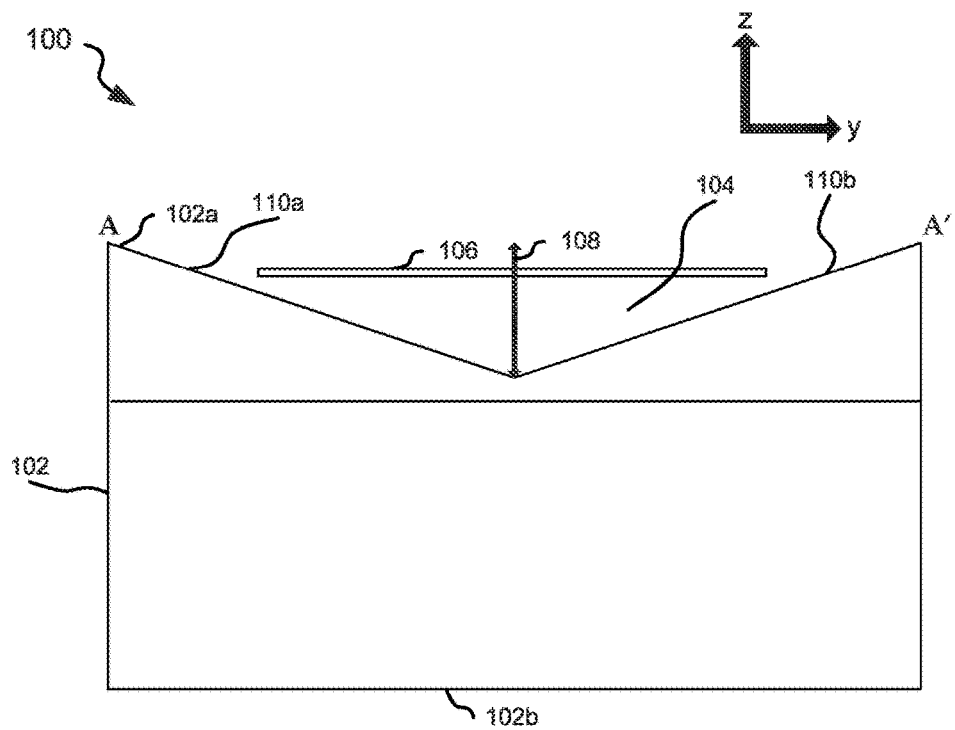
Figure 1D:
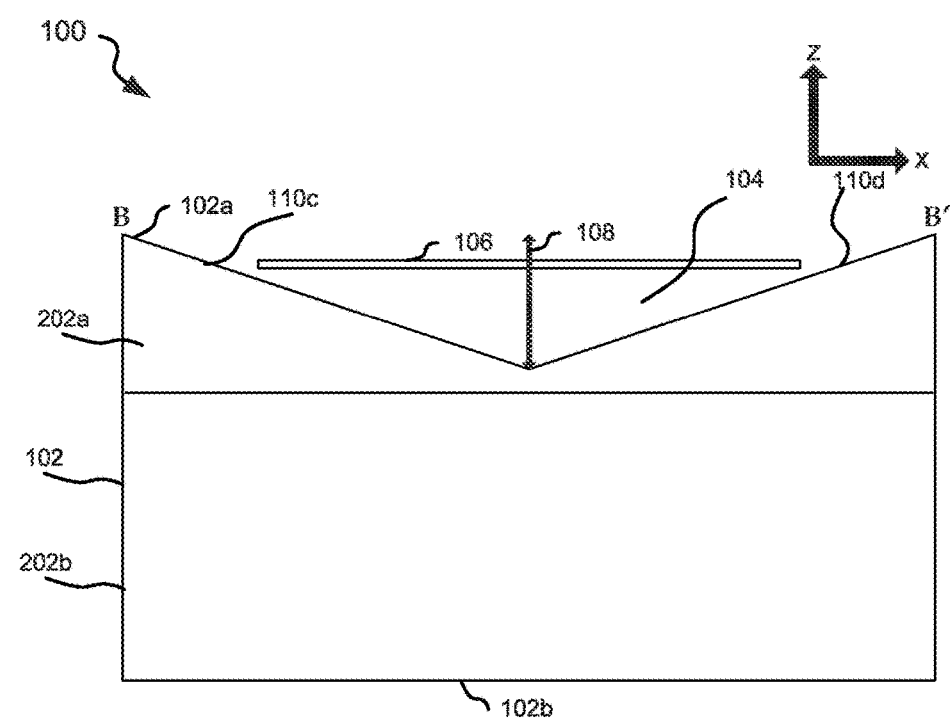

While FIGS. 1a and 1b show the body 102 being completely formed of permanent magnetic material such as hard magnetic material, FIGS. 1c and 1d show a further embodiment wherein the body 102 is composed of a part 202a formed of magnetizable material and a part 202b formed of permanent magnetic material. Part 202a has a plate form with a smaller vertical extension than part 202b. However, other embodiments may have other forms and shapes of parts 202a and 202b. The magnetizable material of part 202a may be soft magnetic material such as iron, steel, steel alloy etc. The magnetic material provides the magnetization for the magnetizable material such that the part 202a is capable of generating the bias magnetic field for the sensor 106. It can be seen that in the embodiments of FIGS. 1c and 1d, the opening 104 is formed only in the part 202a. However, in other embodiments the opening 104 may partially be formed also in the part 202b. Furthermore, it is to be noted that in other embodiments, multiple parts of magnetisable material and multiple parts of magnetic material may be included to form a composite body 102.

In the embodiments of FIGS. 1a to 1d, the sensor 106 is arranged with respect to the vertical direction (z-axis) such that the sensor 106 is within the body 102. In other words, the sensor 106 is laterally bounded at least in the x- and y-direction by the body 102.

Figure 1E:
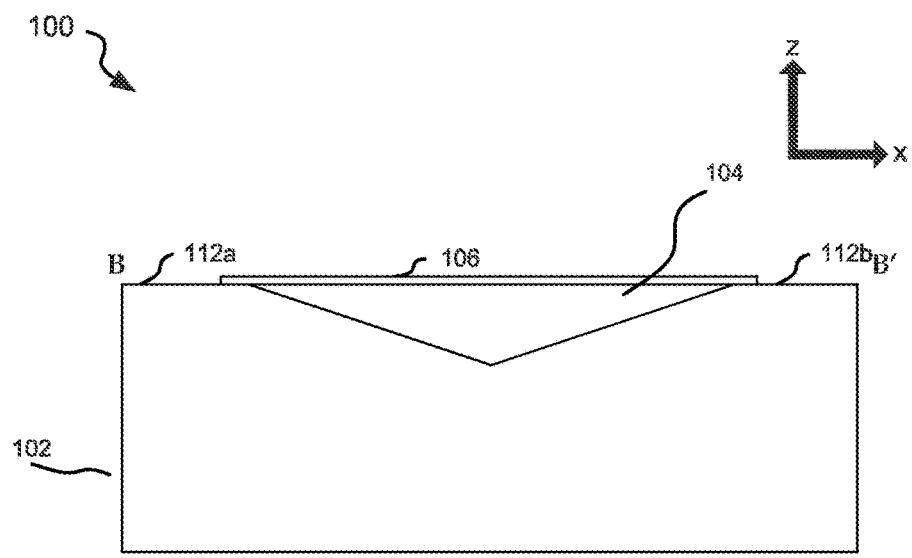

FIG. 1e shows an embodiment, wherein the sensor 106 is placed in the x-direction atop of plane surface portions 112a and 112b. The plane surface portions 112a and 112b are provided at the lateral border of the body 102.

Figure 1F:
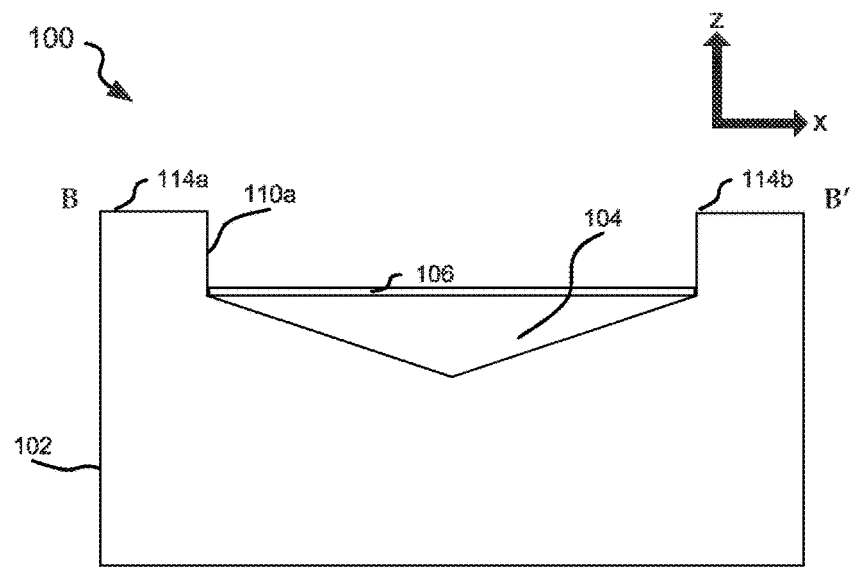

FIG. 1f shows a further embodiment wherein the body 102 comprises in the x-direction two opposing protrusions 114a and 114b. The protrusions 114a and 114b which are located at the respective lateral ends provide a rim or "border ears" for the body 102 allowing a more effective shaping of the x-component of the magnetic field and providing increased linearity to the magnetic field. The protrusions being placed at the border or border area results in having a maximum extension of the body 102 at the border or a local region near the border. The protrusions 114a and 114b may also form a lateral fixation or support for holding and keeping the sensor device 106 in place in the lateral direction. Protrusions 114a and 114b may also be provided for keeping the position of the sensor 106 in the y-direction. However, in one embodiment, the protrusions 114a and 114b may only be provided such that the sensor 106 can be slide along the y-direction at least from one side into the body 102.

Figure 1G:
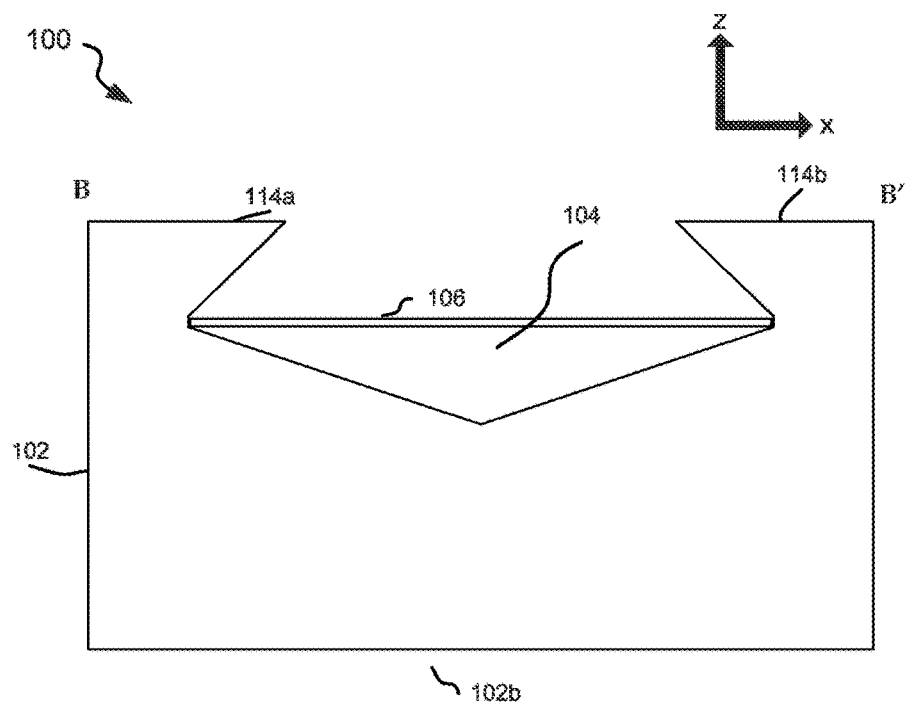

FIG. 1g shows a further embodiment in which the protrusions 114a and 114b have a crane-like form with overhanging surfaces. The crane-like form of the protrusions 114a and 114b in FIG. 1g allows obtaining an even more increased linearity of the magnetic field and therefore a more effective shaping of the magnetic field. In addition to providing a more effective shaping with higher linearity of the magnetic field, the synergetic effect of a positional fixation in the x-direction as well as a positional fixation in the vertical direction is obtained. The positional fixations may be advantageously used for example during a molding step in which the sensor 106 and the magnet are together over molded with mold material to obtain a protection for the sensor 106 and the body 102.

Figure 1H:
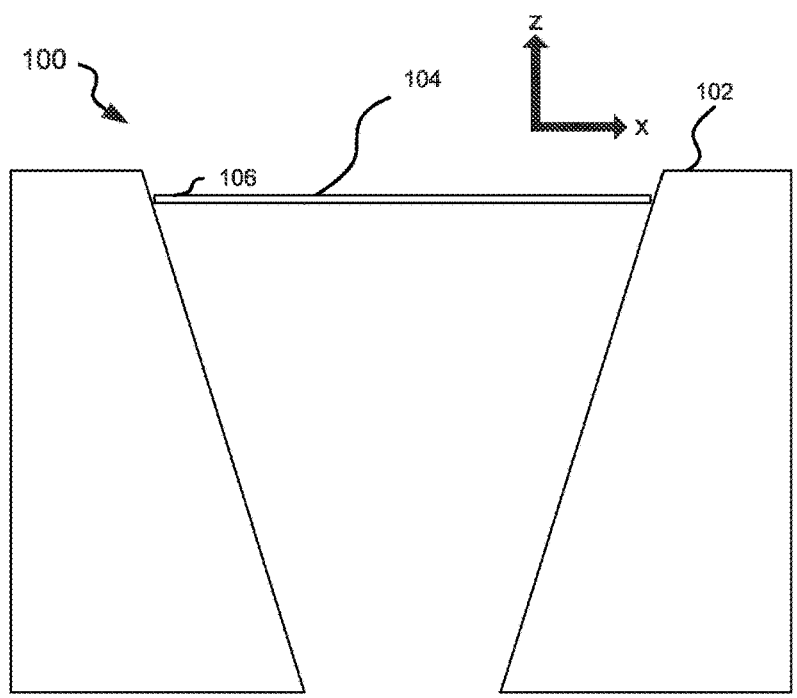

FIG. 1h shows an embodiment wherein the opening 104 penetrates in the vertical direction throughout the whole body 102 to form a hole in the body 102. The sensor 106 is placed in the embodiment according to FIG. 1h completely within the body 102. FIG. 1h shows the opening 104 to have an inclined surface with respect to the vertical direction such that the width in x-direction increases towards the sensor 106. However, other embodiments may provide other inclinations or no inclination with respect to the vertical direction.

Figure 2A:
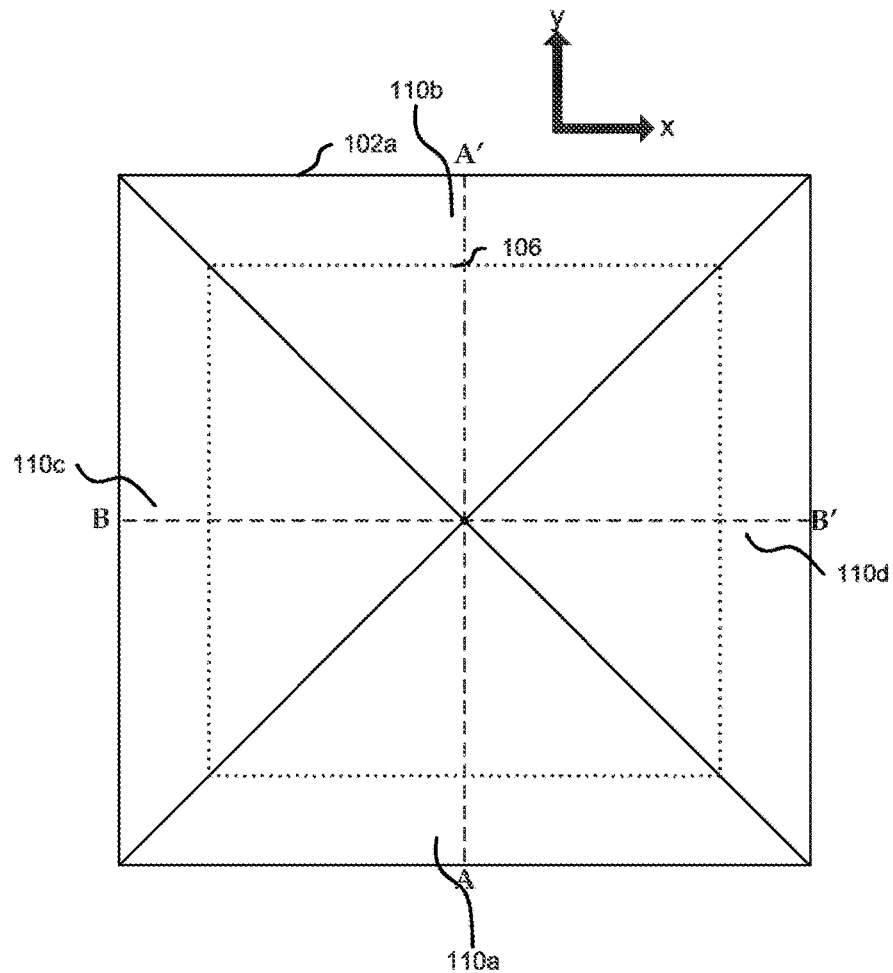
FIGS. 2a to 2c schematic top views of embodiments.
Figure 2B:
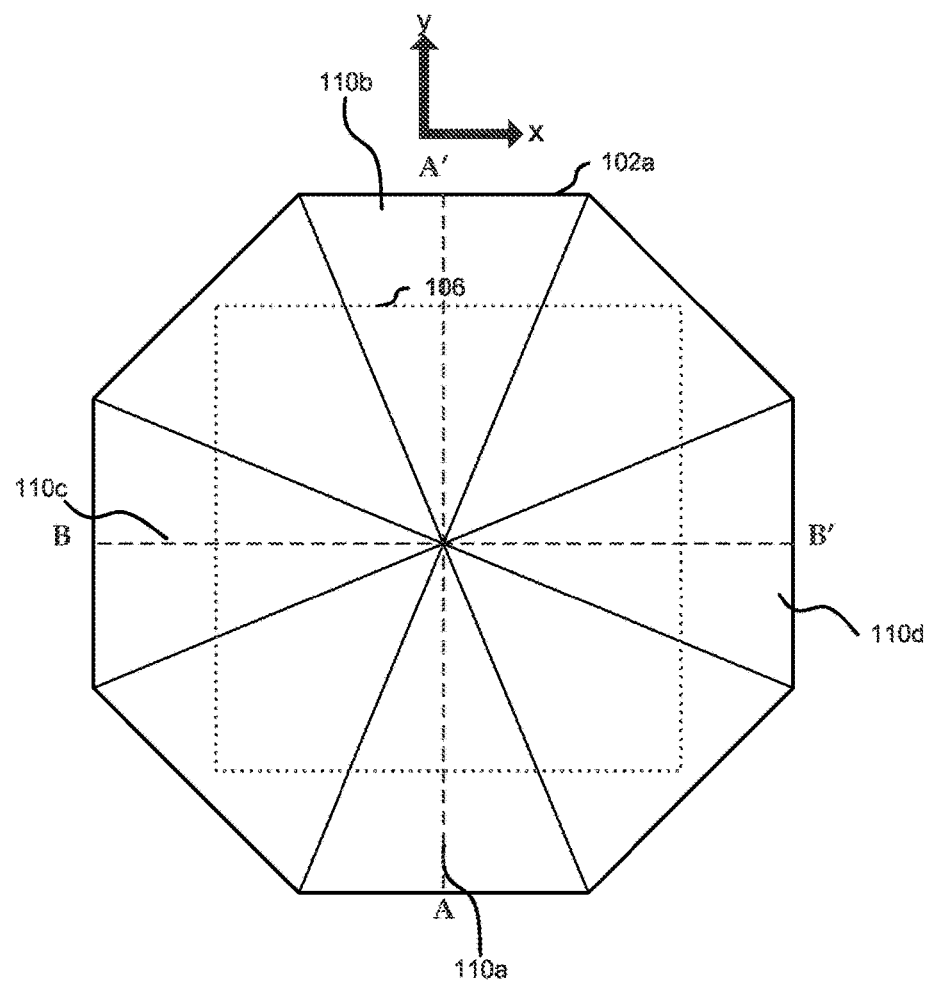
Figure 2C:
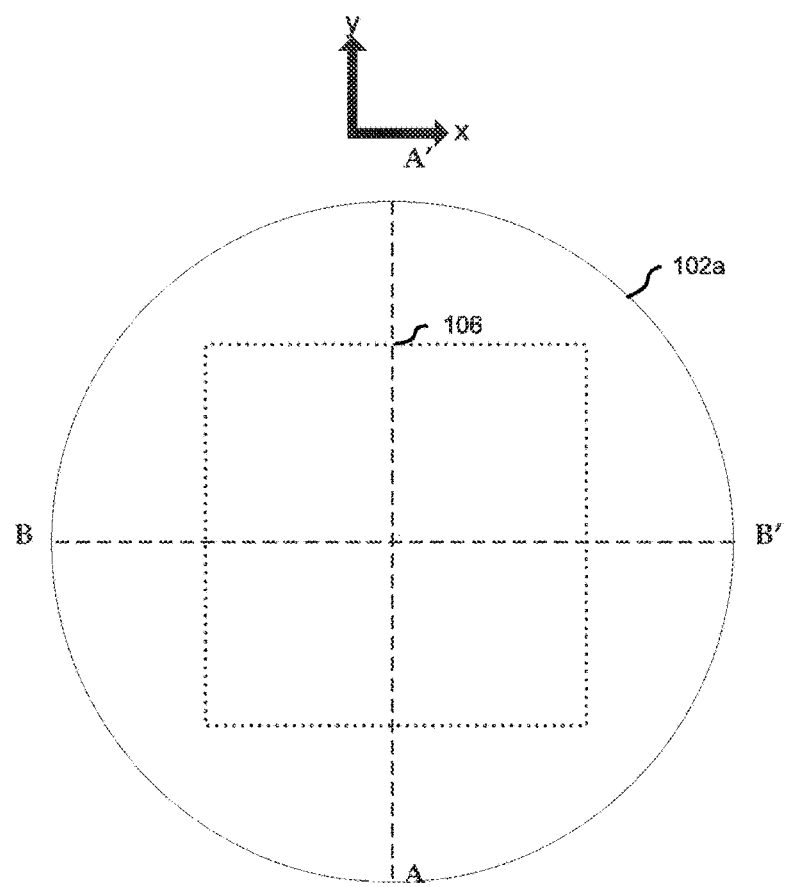

Having now described cross-sectional views of embodiments, FIGS. 2a to 2c show exemplary top views which may apply to each of the embodiments described with respect to FIGS. 1a to 1h.

Figure 3A:
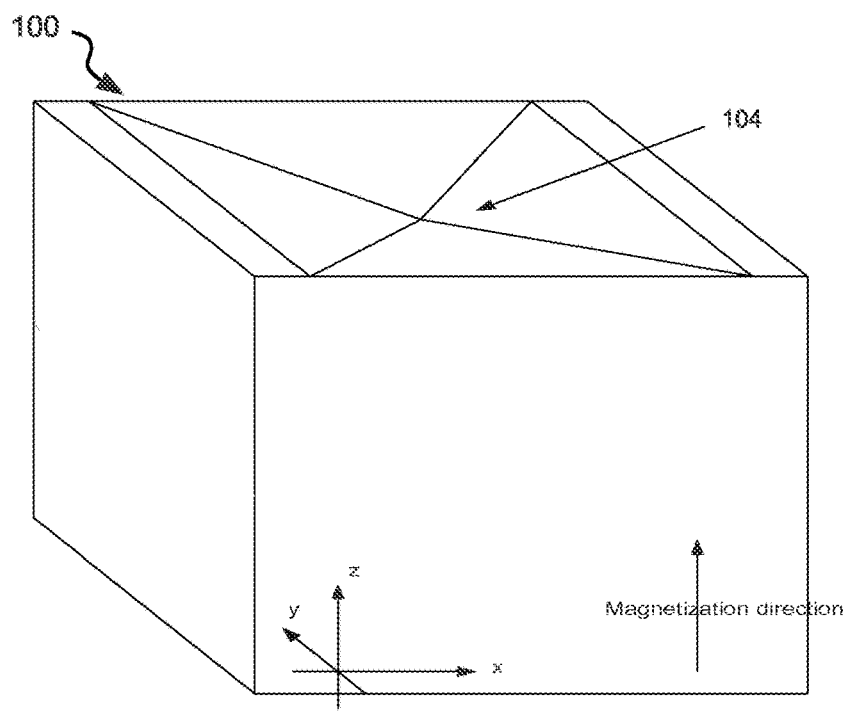
FIGS. 3a and 3b three-dimensional views of embodiments.
Figure 3B:
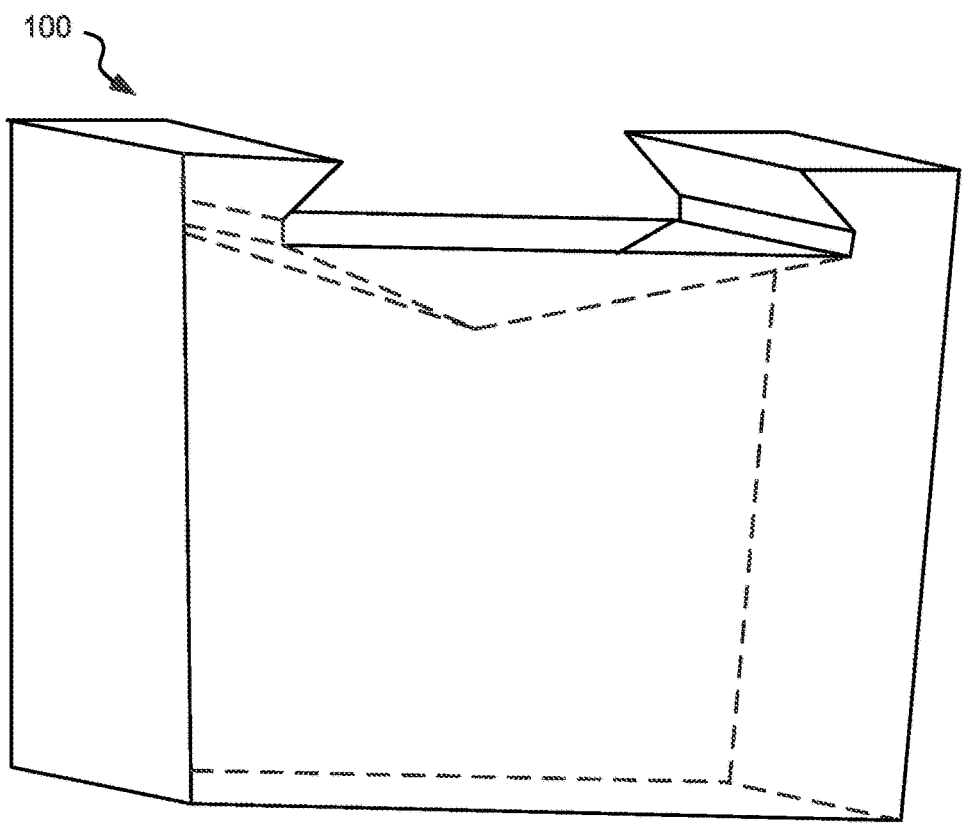

FIG. 2a shows a top-view of the body 102 wherein the opening 104 has a pyramid shape or a shape of half of an octahedron. A three-dimensional view of the pyramid-shape when provided in an embodiment described with respect to FIG. 1e is shown in FIG. 3a. Furthermore, a three-dimensional view of the pyramid shape when applied to an embodiment having a protrusion at a lateral border as described with respect to FIG. 1g is shown in FIG. 3b.

While FIG. 2a shows the pyramid shape in top-view to have a quadratic form, it may be noted that also a rectangle form with extensions in x and y-direction being different may be provided in embodiments.

FIG. 2b shows a top-view of the body 102 wherein the opening 104 has the shape of one half of a polyhedron with 16 surfaces. In embodiments, the opening 104 may have the form of regular polyhedrons or parts of regular polyhedrons.

FIG. 2c shows a top-view of the body 102 according to a further embodiment where the opening 104 has a circular form with decreasing radius when moved along the vertical line. FIG. 2c shows the opening 104 in the form of a cone. In a further embodiment, the opening 104 may have the form of a truncated cone.

Each of the top view forms shown and described with respect to FIGS. 2a to 2c may be have one of the cross-sectional views shown and described with respect to FIGS. 1a to 1h. For example, the protrusions shown in FIGS. 1f and 1g may be provided for the pyramid shape as shown and described with respect to FIG. 2a, for the polyhedron shape as shown and described with respect to FIG. 2b or for the cone shape as shown and described with respect to FIG. 2c.

Each of the embodiments shown in FIGS. 2a to 2c has in the x-y plane a symmetric structure with a defined center of symmetry. For such structures, the region of zero or substantially zero magnetic x- and y-components includes the center of symmetry. However, other embodiments may have a non-symmetric structure when viewed from the top.

In one embodiment, the body 102 forming the bias magnet for the sensor 106 can be manufactured by molding hard magnetic and/or soft magnetic material. The molding of the body 102 with its geometrical shape can be done with mold tools directly on top of the sensor 106 as an additional packaging step. In some embodiments, the body 102 and the sensor 106 may be integrated. In some embodiments, the body 102 and the sensor 106 may be integrated within a common package which may be formed by molding over the body 102 and the sensor 106. In some embodiments, the body 102 can be assembled on the sensor 106 with the usage of adhesive glues or only with mechanical clamping mechanism. In some embodiments, the body 102 can be assembled with the sensor 106 and fixed with a mold material that is molded around the whole system for example in a thermoplast injection mold process.

An embodiment showing an exemplary operation of the sensor 106 biased by the body 102 will now be described with respect to FIG. 4a.

Figure 4A:
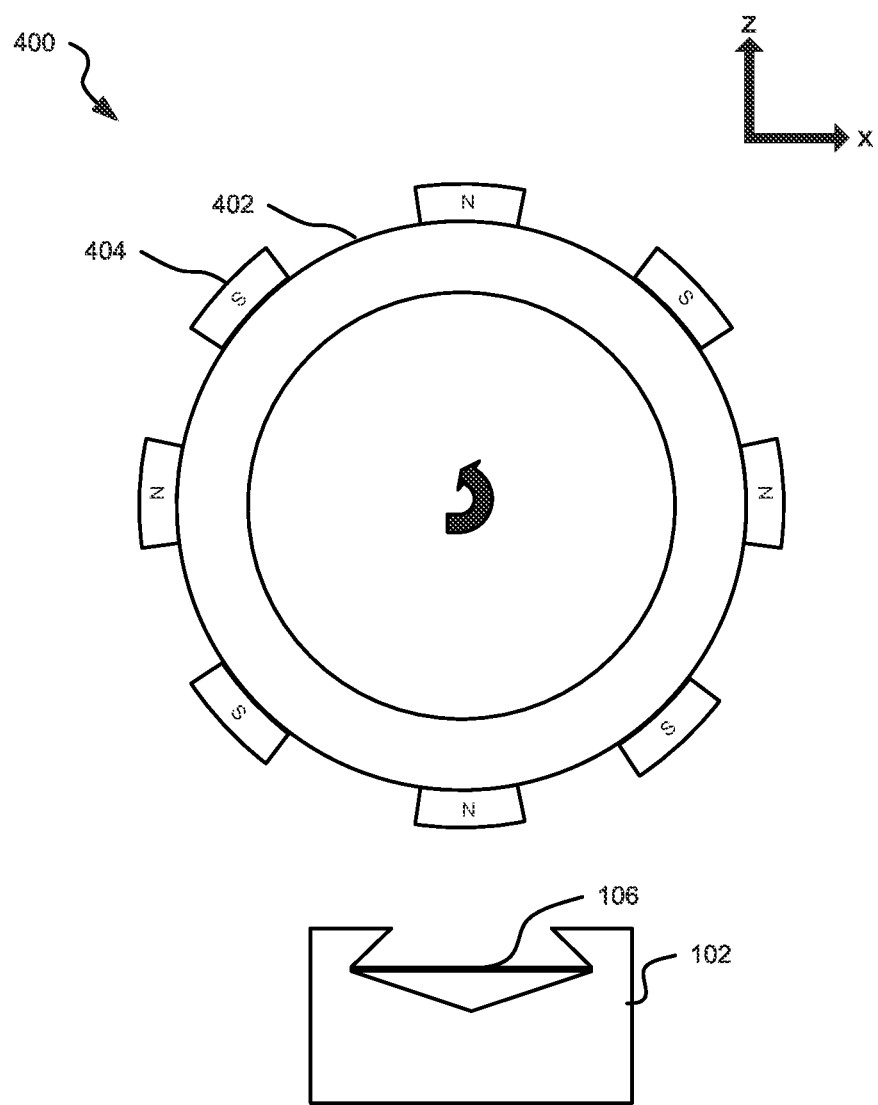
FIG. 4a a schematic view of a system according to embodiments.

FIG. 4a shows a system 400 having the sensor 106 arranged near a rotary element 402 for detecting a rotation of the element 402. The system 400 is provided in a back bias manner with the sensor 106 arranged between the body 102 generating the bias magnet field and the rotary element 402. While the body 102 shown in FIG. 4a corresponds to the arrangement shown in FIG. 1g, it is apparent that each of the described embodiments can also be implemented.

The sensor 106 may be provided centered in the region with zero x- and y-field components for obtaining maximum sensitivity. In other embodiments, the sensor 106 may be off-centered or outside the region with zero x- and y-field components in order to reduce the sensitivity. This may for example be achieved by having the sensor 106 moved away from the region with zero x- and y-component along the guide or support formed by protrusions 114a and 114b.

As can be seen from FIG. 4a, the rotary element 402 is capable to rotate such that the axis of the rotation is directed in the y-direction. The rotary element 402 has a plurality of magnets 404 with alternating magnetization provided at a surface of the rotary element 402. When the rotary element 402 rotates, the magnetic field generated by the magnets 404 is applied to the sensor 106. The sensor 106 has the sensing direction along the x-direction. The sensor 106 experiences a change of the direction of the x-component of the magnetic field which is detected by the sensor 106 having its sensing direction in the x-direction. The bias magnetic field generated by the body 102 provides the sensor 106 at a working point to avoid saturation and/or other adverse effects.

Figure 4B:
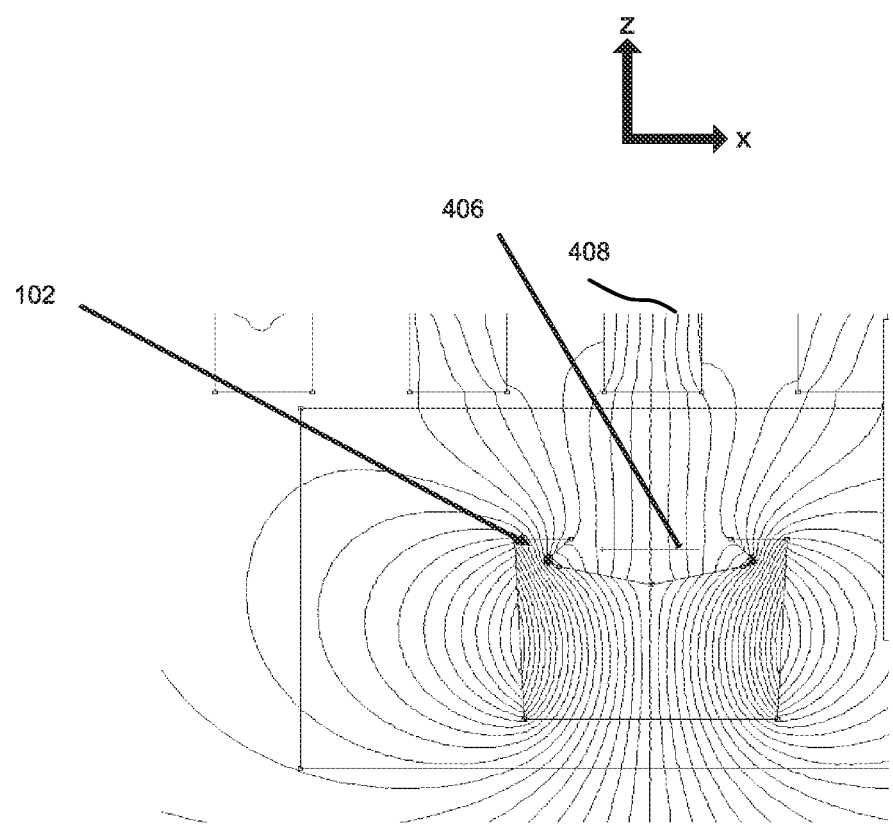
FIG. 4b a simulation showing magnetic field lines according to an embodiment.

FIG. 4b shows an exemplary simulation of the magnetic field generated by an arrangement similar to FIG. 1g with a moving element 408 comprising magnetic permeable material. It can be seen that the body 102 generates within a region 406 substantially zero x- and y-field components within the body 102. It can be seen that the region 406 extends lateral over more than half of the size of the opening 104. As described above, the sensing elements of the sensor 106 may provided to be within the region 406 to obtain maximum sensitivity or outside of the region 406 to obtain a reduced sensitivity by purpose.

In the above description, embodiments have been shown and described herein enabling those skilled in the art in sufficient detail to practice the teachings disclosed herein. Other embodiments may be utilized and derived there from, such that structural and logical substitutions and changes may be made without departing from the scope of this disclosure.

This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

It is further to be noted that embodiments described in combination with specific entities may in addition to an implementation in these entity also include one or more implementations in one or more sub-entities or sub-divisions of said described entity.

The accompanying drawings that form a part hereof show by way of illustration, and not of limitation, specific embodiments in which the subject matter may be practiced.

In the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent claim. Such combinations are proposed herein unless it is stated that a specific combination is not intended.

It is further to be noted that methods disclosed in the specification or in the claims may be implemented by a device having means for performing each of the respective steps of these methods.

What is claimed is:

1. A device comprising:
   a magnetic sensor; and
   a bias field generator including a cavity having a width along a first direction, wherein the width increases from a minimum width to a maximum width as a distance from the magnetic sensor along a second direction orthogonal to the first direction increases, the minimum width of the cavity being smaller than a width of the magnetic sensor.

2. The device according to claim 1, wherein the cavity is defined by two or more inclined surfaces.

3. The device according to claim 2, wherein the cavity is pyramidal.

4. The device according to claim 1, wherein the cavity is conical.

5. The device according to claim 1, wherein the cavity is pyramidal.

6. The device according to claim 2, wherein an inclination angle between at least one of the inclined surfaces and the second direction is in a range between 5° and 20°.

7. The device according to claim 1, wherein the bias field generator is configured to generate a magnetic field such that a lateral magnetic field component of the magnetic field is substantially zero along the second direction at a location of the magnetic sensor.

8. The device according to claim 1, wherein a package is formed by molding around the magnetic sensor and the bias field generator.

9. The device according to claim 1, wherein the cavity is filled with a material that is non-magnetic and non-magnetizable.

10. A device comprising:
    a magnetic sensor; and
    a bias field generator arranged adjacent to the magnetic sensor in a first direction, the bias field generator including a cavity formed in the bias field generator and defined by first and second inclined surfaces, the cavity having a width along a second direction orthogonal to the first direction that increases from a minimum width to a maximum width as a distance from the magnetic sensor along the first direction increases, wherein the magnetic sensor is laterally bound by the first and the second inclined surfaces in the second direction, the minimum width of the cavity being smaller than a width of the magnetic sensor.

11. The device according to claim 10, wherein:
    the cavity is further defined by third and fourth inclined surfaces; and
    the magnetic sensor is further laterally bound by the third and the fourth inclined surfaces in a third direction orthogonal to the second direction and orthogonal to the first direction.

12. The device according to claim 10, wherein the cavity is pyramidal.

13. The device according to claim 10, wherein an inclination angle between at least one of the first and second inclined surfaces and the second direction is in a range between 5° and 20°.

14. The device according to claim 10, wherein the bias field generator is configured to generate a magnetic field such that a lateral magnetic field component of the magnetic field is substantially zero along the second direction at a location of the magnetic sensor.

15. The device according to claim 10, wherein a package is formed by molding around the magnetic sensor and the bias field generator.

16. The device according to claim 10, wherein the cavity is filled with a material that is non-magnetic and non-magnetizable.

17. A device comprising:
    a magnetic sensor; and
    a bias field generator arranged with respect to the magnetic sensor in a first direction, the bias field generator including a cavity formed in the bias field generator and extending into the bias field generator in the first direction,
    wherein a cross-sectional area of the cavity defined in a plane that extends along a second direction orthogonal to the first direction and along a third direction orthogonal to the first and the second directions increases from a minimum cross-sectional area to a maximum cross-sectional area as a distance from the magnetic sensor along the first direction increases, the minimum cross-sectional area of the cavity being smaller than a cross-sectional area of the magnetic sensor defined in the plane.

18. The device according to claim 17, wherein the bias field generator is arranged below the magnetic sensor in the first direction.

19. The device according to claim 17, wherein the magnetic sensor is disposed within the cavity and is laterally bound by the cavity in the second direction and the third direction.

20. The device according to claim 17, wherein the cavity is pyramidal or conical.

* * * * *